United States Patent
Li et al.

(10) Patent No.: US 11,943,853 B2
(45) Date of Patent: Mar. 26, 2024

(54) FULL VOLTAGE SAMPLING CIRCUIT, DRIVING CHIP, LED DRIVING CIRCUIT AND SAMPLING METHOD

(71) Applicant: SHANGHAI BRIGHT POWER SEMICONDUCTOR CO., LTD., Shanghai (CN)

(72) Inventors: Zhen Li, Shanghai (CN); Weijia Yu, Shanghai (CN); Minmin Fan, Shanghai (CN)

(73) Assignee: SHANGHAI BRIGHT POWER SEMICONDUCTOR CO., LTD., Shanghai (CN)

( * ) Notice: Subject to any disclaimer, the term of this patent is extended or adjusted under 35 U.S.C. 154(b) by 34 days.

(21) Appl. No.: 18/051,882

(22) Filed: Nov. 2, 2022

(65) Prior Publication Data

US 2023/0209688 A1    Jun. 29, 2023

(30) Foreign Application Priority Data

Dec. 29, 2021 (CN) .......................... 202111637680.4

(51) Int. Cl.
  *H05B 47/14* (2020.01)
  *G01R 19/00* (2006.01)
  *H05B 45/3725* (2020.01)

(52) U.S. Cl.
  CPC ......... *H05B 47/14* (2020.01); *G01R 19/0038* (2013.01); *H05B 45/3725* (2020.01)

(58) Field of Classification Search
  CPC ........ H05B 45/14; H05B 45/24; H05B 47/14; H05B 45/3725; H05B 45/30; H05B 47/105; G01R 19/0038
  See application file for complete search history.

(56) References Cited

U.S. PATENT DOCUMENTS

2013/0151875 A1 * 6/2013 Huynh ...................... G06F 1/26
                                                        713/310

FOREIGN PATENT DOCUMENTS

| CN | 207235165 U | * | 4/2018 | ............. H05B 45/00 |
| CN | 107995736 A | * | 5/2018 | ......... H05B 33/0812 |
| CN | 209572189 U | * | 11/2019 | |
| CN | 111901932 A | * | 11/2020 | ............... H04N 5/63 |
| CN | 112333873 A | * | 2/2021 | ............. H05B 45/10 |
| CN | 112367748 A | * | 2/2021 | .......... H02M 1/4233 |
| CN | 214708114 U | * | 11/2021 | ............. H05B 45/36 |

* cited by examiner

*Primary Examiner* — Abdullah A Riyami
*Assistant Examiner* — Syed M Kaiser
(74) *Attorney, Agent, or Firm* — CKC & Partners Co., LLC

(57) ABSTRACT

A full voltage sampling circuit includes a main sampling circuit, an assist sampling circuit and a processing circuit. The main sampling circuit receives first and second input voltages, and outputs a first sampling signal according to the first and second input voltages. The first sampling signal represents a differential voltage which indicates a difference between the first input voltage and the second input voltage. The assist sampling circuit receives the first and second input voltages, and outputs a second sampling signal according to the first and second input voltages. The second sampling signal represents the differential voltage. The processing circuit is coupled to the main sampling circuit and the assist sampling circuit, and selects a larger one of currents or voltages of the first and second sampling signals as a sampling result to be outputted.

20 Claims, 7 Drawing Sheets

FULL VOLTAGE SAMPLING CIRCUIT, DRIVING CHIP, LED DRIVING CIRCUIT AND SAMPLING METHOD

CROSS-REFERENCE TO RELATED APPLICATION

This application claims priority to China Application Serial Number 202111637680.4, filed Dec. 29, 2021, which is herein incorporated by reference in its entirety.

BACKGROUND

Technical Field

The present disclosure relates to a technology field of integrated circuits. More particularly, the present disclosure relates to a full voltage sampling circuit, a driving chip, a light emitting diode (LED) driving circuit and a sampling method.

Description of Related Art

Metal-oxide-semiconductor (MOS) transistors in a traditional inductance-current difference sampling circuit may be implemented by high voltage transistors and low voltage isolation transistors. However, consumptions of certain voltage drops are required between a drain and a source of the MOS transistors, to satisfy a requirement of operating in a saturation region. Therefore, when an input voltage is too low, the sampling circuit cannot operate normally.

Especially, reference is made to FIG. 1 which corresponds to a variation curve of an output sampling voltage and an input voltage of the sampling circuit. As illustratively shown in FIG. 1, when the input voltage is very small, the sampling voltage is smaller than an actual voltage, because the device is not saturated yet at this moment. When the input voltage is increased gradually, the sampling voltage is increased gradually. When the input voltage is large enough such that the device is saturated, under an ideal condition, the sampling voltage is equal to the actual voltage. Thereafter, no matter the input voltage is further increased or not, the sampling voltage is not changed if the actual voltage is not changed. Therefore, when the input voltage is very small, a sampling result of the traditional inductance-current difference sampling circuit has deviation, such that the sampling result is not accurate. Based on above, related existing techniques need to be improved and upgraded.

SUMMARY

The present disclosure provides a full voltage sampling circuit. The full voltage sampling circuit includes a main sampling circuit, an assist sampling circuit and a processing circuit. The main sampling circuit is configured to receive a first input voltage and a second input voltage, and is configured to output a first sampling signal according to the first input voltage and the second input voltage. The first sampling signal represents a differential voltage which indicates a difference between the first input voltage and the second input voltage. The assist sampling circuit is configured to receive the first input voltage and the second input voltage, and is configured to output a second sampling signal according to the first input voltage and the second input voltage. The second sampling signal represents the differential voltage. The processing circuit is coupled to the main sampling circuit and the assist sampling circuit, and is configured to select a larger one of currents or voltages of the first sampling signal and the second sampling signal as a sampling result to be outputted.

The present disclosure provides a driving chip. The driving chip includes the full voltage sampling circuit described above, and is applied to a light emitting diode driving circuit or a direct current to direct current converter.

The present disclosure provides a light emitting diode (LED) driving circuit. The LED driving circuit includes an inductor, a sampling resistor and the full voltage sampling circuit described above. The inductor is coupled in series with a LED light emitting load. The sampling resistor is coupled in series with the inductor. The full voltage sampling circuit is configured to sense an induced current flowing through the LED light emitting load.

The present disclosure provides a sampling method. The sampling method is applied to the full voltage sampling circuit described above. The sampling method includes: deriving the first sampling signal outputted by the main sampling circuit and the second sampling signal outputted by the assist sampling circuit; when a voltage or a current of the first sampling signal is smaller than or equal to a voltage or a current of the second sampling signal, outputting the voltage or the current of the second sampling signal as the sampling result; and when the voltage or the current of the first sampling signal is larger than or equal to the voltage or the current of the second sampling signal, outputting the voltage or the current of the first sampling signal as the sampling result.

Compared with the existing techniques, the present disclosure provides a full voltage sampling circuit, a driving chip, a LED driving circuit and a sampling method. An assist sampling circuit and a processing circuit are configured in the full voltage sampling circuit. Each of a main sampling circuit and the assist sampling circuit performs sampling according to a first input voltage and a second input voltage. Thereafter, the processing circuit compares magnitudes of voltage values and current values of two sampling signals corresponding to the first input voltage and the second input voltage. In order to prevent a sampling result, obtained by sampling, from being smaller than an actual differential voltage when the input voltage is too small, the processing circuit selects a larger one of the voltages or currents of the first sampling signal and the second sampling signal as the sampling result to be outputted, such that the sampling result is not affected by the magnitudes of the input voltages, and thus an accuracy of the sampling result is ensured.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

In the present disclosure, when an element is referred to as "connected" or "coupled", it may mean "electrically connected" or "electrically coupled". "Connected" or "coupled" can also be used to indicate that two or more components operate or interact with each other. In addition, although the terms "first", "second", and the like are used in the present disclosure to describe different elements, the terms are used only to distinguish the elements or operations described in the same technical terms. The use of the term is not intended to be a limitation of the present disclosure.

The terms used in the present disclosure are only used for the purpose of describing specific embodiments and are not intended to limit the embodiments. As used in the present disclosure, the singular forms "a", "one" and "the" are also intended to include plural forms, unless the context clearly indicates otherwise. It will be further understood that when used in this specification, the terms "comprises (comprising)" and/or "includes (including)" designate the existence of stated features, steps, operations, elements and/or components, but the existence or addition of one or more other features, steps, operations, elements, components, and/or groups thereof are not excluded.

A purpose of present disclosure is providing a full voltage sampling circuit, a driving chip, a LED driving circuit and a sampling method, to solve a problem of the sampling result being not accurate when an input voltage is small.

In order to clarify and specify purposes, techniques and effects of the present disclosure, embodiments are made with referring to figures to further describe the present disclosure. It is noted that the embodiments are for explaining the present disclosure, and not for limiting the present disclosure.

Figure 1:
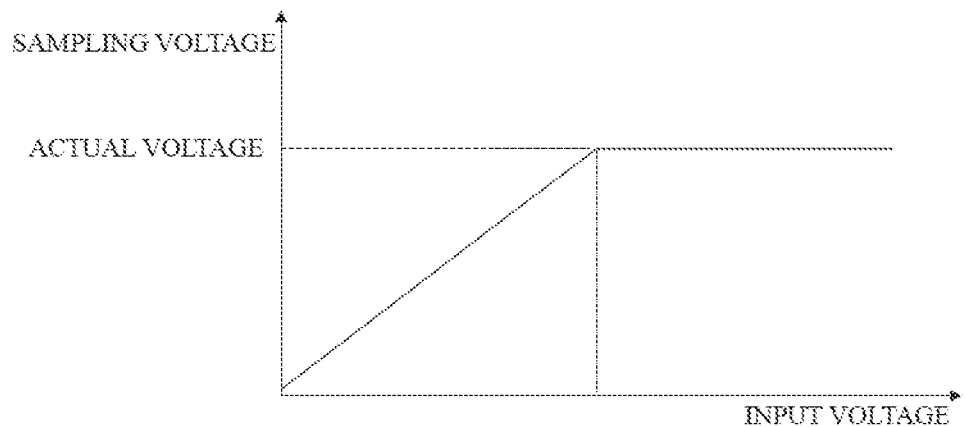
FIG. 1 is a schematic diagram of sampling results of an existing sampling circuit.
Figure 2:
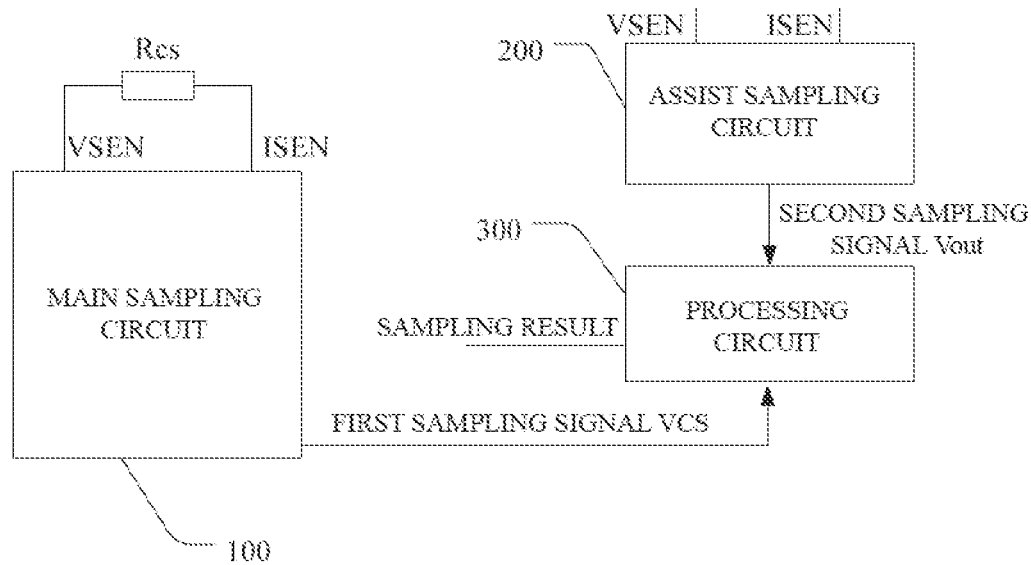
FIG. 2 is a structural block diagram of a full voltage sampling circuit illustrated according to one embodiment of the present disclosure.

Referring to FIG. 2, the full voltage sampling circuit provided by present disclosure includes a main sampling circuit 100, an assist sampling circuit 200 and a processing circuit 300. Each of the main sampling circuit 100 and the assist sampling circuit 200 is configured to receive a first input voltage VSEN and a second input voltage ISEN. The processing circuit 300 is connected to the main sampling circuit 100 and the assist sampling circuit 200. A difference between the first input voltage VSEN and the second input voltage ISEN is referred to as a differential voltage. The differential voltage corresponds to a sampling result of the full voltage sampling circuit. Specifically, the main sampling circuit 100 is configured to output a first sampling signal VCS according to the first input voltage VSEN and the second input voltage ISEN. The first sampling signal VCS represents the differential voltage. The assist sampling circuit 200 is configured to receive the first input voltage VSEN and the second input voltage ISEN, and is configured to output a second sampling signal Vout according to the first input voltage VSEN and the second input voltage ISEN. The second sampling signal Vout also represents the differential voltage. In various embodiments, the first sampling signal VCS may be a voltage or a current. The processing circuit 300 is configured to select a larger one of the voltages or the currents of the first sampling signal VCS and the second sampling signal Vout as the sampling result to output.

The assist sampling circuit 200 and the processing circuit 300 are configured in the full voltage sampling circuit. Each of the main sampling circuit 100 and the assist sampling circuit 200 performs sampling according to the first input voltage VSEN and the second input voltage ISEN. Thereafter, the processing circuit 300 compares magnitudes of voltage values or current values of two sampling signals VCS and Vout. In order to prevent the sampling result, obtained by sampling, from being smaller than an actual differential voltage when the input voltage is too small, the processing circuit 300 selects a larger one of the voltages or currents of the first sampling signal VCS and the second sampling signal Vout as the sampling result to be outputted, such that the sampling result is not affected by the magnitudes of the input voltages, and thus an accuracy of the sampling result is ensured.

In some embodiments, when the first input voltage VSEN is smaller than a reference voltage, the processing circuit 300 outputs the second sampling signal Vout as the sampling result. When the first input voltage VSEN is larger than the reference voltage, the processing circuit 300 outputs the first sampling signal VCS as the sampling result. In some embodiments, the reference voltage is not set in advance. A voltage value of the reference voltage is approximately equal to a voltage value of the first input voltage VSEN when the full voltage sampling circuit is transformed from a first state to a second state. At the first state, the second sampling signal Vout is outputted as the sampling result. At the second state, the first sampling signal VCS is outputted as the sampling result.

In some embodiments, as the first input voltage VSEN is increased, the transformation from the first state to the second state is not completed in an instant, but needs to go through a transformation time, during which the voltages or the currents of the first sampling signal VCS and the second sampling signal Vout are close to each other. Accordingly, the voltage value of the reference voltage is approximately equal to the voltage value of first input voltage VSEN during the transformation time. In some embodiments, the transformation is completed in an instant, and the value of the reference voltage corresponds to a boundary value during the transformation. A corresponding example is described as follows.

In some embodiments, when the first input voltage VSEN is smaller than the reference voltage, a sampling result of the main sampling circuit 100 is affected by the first input voltage VSEN and has a deviation. When the first input voltage VSEN is larger than the reference voltage, it indicates that the first input voltage VSEN reaches a voltage value sufficient to saturate the devices in the main sampling circuit 100, the sampling result of the main sampling circuit 100 is not affected by the first input voltage VSEN, and the sampling result is accurate. Accordingly, when the first input voltage VSEN is smaller than the reference voltage, the second sampling signal Vout of the assist sampling circuit 200 is selected as the sampling result. When the first input voltage VSEN is larger than the reference voltage, the first sampling signal VCS of the main sampling circuit 100 is selected as the sampling result. Therefore, a full voltage sampling is accomplished, and the accuracy of the sampling result is ensured.

In some embodiments, when the first input voltage VSEN is smaller than the reference voltage, a difference between the actual differential voltage and the voltage of the first sampling signal VCS is decreased as the first input voltage VSEN is increased, and the first sampling signal VCS derived by sampling of the main sampling circuit 100 is increased as the first input voltage VSEN is increased. At this stage, the first sampling signal VCS approaches the actual differential voltage gradually, a sampling deviation of the main sampling circuit 100 is decreased, a sampling accuracy is increased, and the second sampling signal Vout of the assist sampling circuit 200 is selected as the sampling result to be outputted.

In some embodiments, when the first input voltage VSEN is larger than the reference voltage, the difference between the actual differential voltage and the voltage of the second sampling signal Vout is increased as the first input voltage VSEN is increased, and is deviated from the actual differential voltage gradually. At this stage, the first sampling signal VCS of the main sampling circuit 100 is selected as the sampling result.

In some embodiments, the processing circuit 300 is configured to select a larger one of the voltages or the currents of the first sampling signal VCS and the second sampling signal Vout as the sampling result to be outputted. When the first input voltage VSEN is smaller than the reference voltage, the voltage value of the first sampling signal VCS is clamped as the voltage of the second sampling signal Vout, to ensure the accuracy of the outputted sampling result when the first input voltage VSEN is smaller than the reference voltage.

Figure 3:
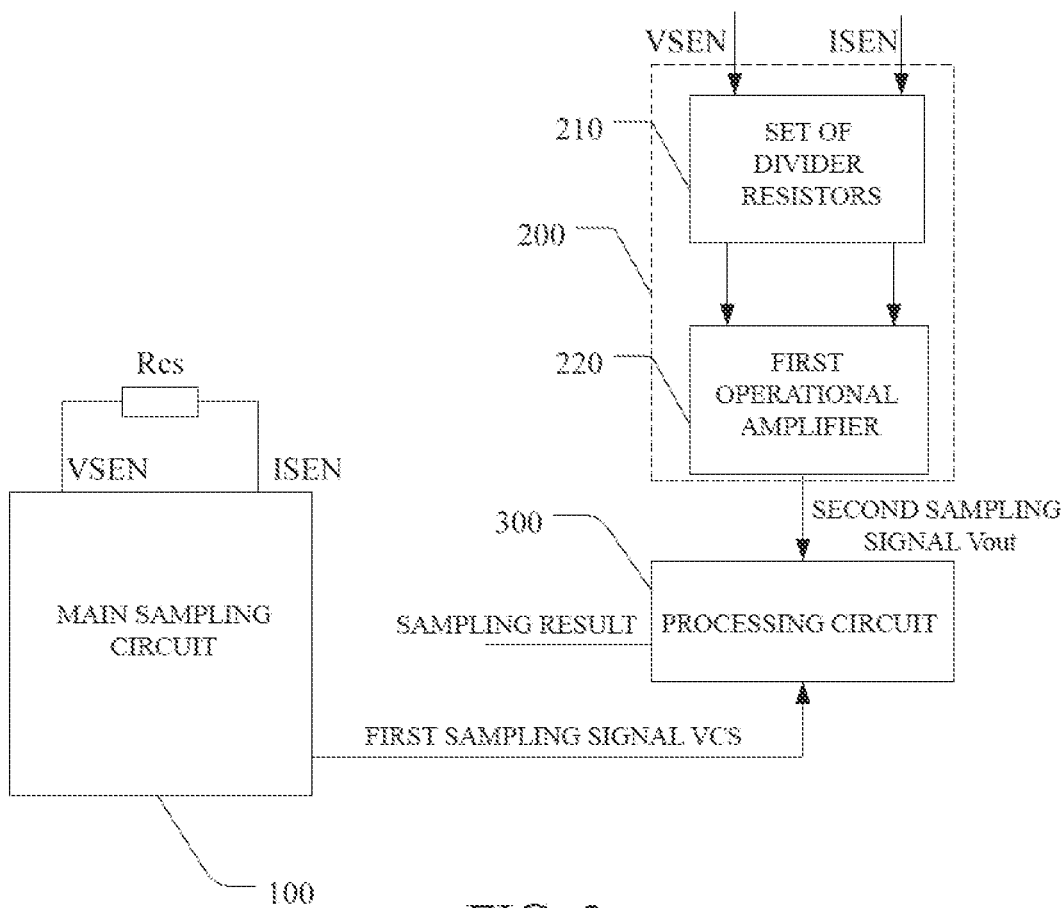
FIG. 3 is a structural block diagram of an assist sampling circuit in the full voltage sampling circuit illustrated according to one embodiment of the present disclosure.

Referring to FIG. 3, in some embodiments, the assist sampling circuit 200 includes a set of divider resistors 210 and a first operational amplifier 220. The set of divider resistors 210 is configured to receive and divide the first input voltage VSEN and the second input voltage ISEN, and output a first divided voltage V+ corresponding to the first input voltage VSEN and a second divided voltage V− corresponding to the second input voltage ISEN. The first operational amplifier 220 is connected to the set of divider resistors 210, and is configured to output the second sampling signal Vout according to the first divided voltage V+ and the second divided voltage V−.

In some embodiments, the assist sampling circuit 200 is configured to output the second sampling signal Vout by calculations and performing sampling to the first input voltage VSEN and the second input voltage ISEN. Accordingly, the full voltage sampling circuit is able to operate normally to obtain accurate voltage values when the first input voltage VSEN is small.

Figure 4:
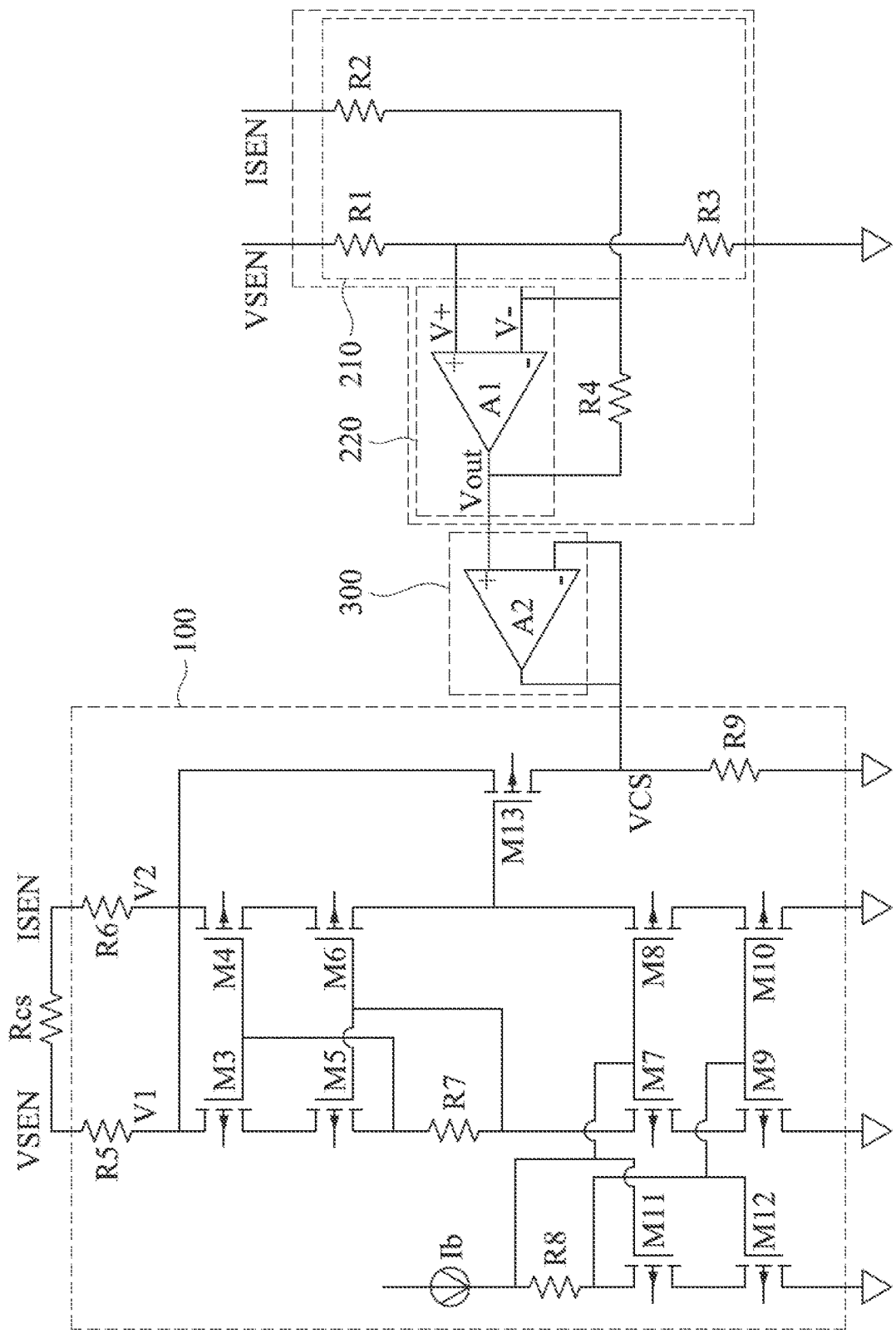
FIG. 4 is a circuit diagram of the full voltage sampling circuit illustrated according to one embodiment of the present disclosure.

Referring to FIG. 4, in some embodiments, the set of divider resistors 210 includes a first resistor R1, a second resistor R2, a third resistor R3 and a fourth resistor R4. A first terminal of the first resistor R1 is configured to receive the first input voltage VSEN. Each of a second terminal of the first resistor R1 and a first terminal of the third resistor R3 is coupled to a positive phase terminal of the first operational amplifier 220. A second terminal of the third resistor R3 is coupled to a ground. A first terminal of the second resistor R2 is configured to receive the second input voltage ISEN. Each of a second terminal of the second resistor R2 and a first terminal of the fourth resistor R4 is coupled to a negative phase terminal of the first operational amplifier 220. A second terminal of the resistor R4 is coupled to an output terminal of the first operational amplifier 220.

In some embodiments, the first resistor R1 and the third resistor R3 are configured to divide the first input voltage VSEN to derive the first divided voltage V+, and provide the first divided voltage V+ to the positive phase input terminal of the first operational amplifier 220. The second resistor R2 and the fourth resistor R4 are configured to divide the second input voltage ISEN to derive the second divided voltage V−, and provide the second divided voltage V− to the negative phase input terminal of the first operational amplifier 220. The first operational amplifier 220 is configured to output the second sampling signal Vout to the processing circuit 300, for the processing circuit 300 outputting the sampling result.

In some embodiments, the processing circuit 300 includes a second operational amplifier A2. A positive phase terminal of the second operational amplifier A2 is configured to receive the second sampling signal Vout, a negative phase terminal of the second operational amplifier A2 is coupled to an output terminal of the second operational amplifier A2 and configured to receive the first sampling signal VCS, and the output terminal of the second operational amplifier A2 is coupled to the main sampling circuit 100. When the first input voltage VSEN is smaller than the reference voltage, the second operational amplifier A2 is configured to clamp the voltage or the current of the first sampling signal VCS of the main sampling circuit 100 as the voltage or the current of the second sampling signal Vout. Alternatively stated, the second operational amplifier A2 is configured to output the voltage or the current of the second sampling signal Vout as the sampling result. When the first input voltage VSEN is larger than the reference voltage, the second operational amplifier A2 is configured to output the voltage or the current of the first sampling signal VCS as the sampling result, to ensure the accuracy of the sampling result.

In some embodiments, the main sampling circuit 100 includes a fifth resistor R5, a sixth resistor R6, a seventh resistor R7, an eighth resistor R8, a ninth resistor R9, a third MOS transistor M3, a fourth MOS transistor M4, a fifth MOS transistor M5, a sixth MOS transistor M6, a seventh MOS transistor M7, an eighth MOS transistor M8, a ninth MOS transistor M9, a tenth MOS transistor M10, an eleventh MOS transistor M11, a twelfth MOS transistor M12, a thirteenth MOS transistor M13 and a current source. A first terminal of the fifth resistor R5 is configured to receive the first input voltage VSEN at a first signal input terminal. Each of a second terminal of the fifth resistor R5 and a source of the thirteenth MOS transistor M13 is coupled to a drain of the third MOS transistor M3. Each of a gate of the third MOS transistor M3 and a gate of the fourth MOS transistor M4 is coupled to a first terminal of the seventh resistor R7 and a source of the fifth MOS transistor M5. A source of the third MOS transistor M3 is coupled to a drain of the fifth MOS transistor M5. A drain of fourth MOS transistor M4 is coupled to a first terminal of the sixth resistor R6. A second terminal of the sixth resistor R6 is configured to receive the second input voltage ISEN at a second signal input terminal. A source of the fourth MOS transistor M4 is coupled to a drain of the sixth MOS transistor M6. Each of a gate of the sixth MOS transistor M6 and a gate of the fifth MOS transistor M5 is coupled to a second terminal of the seventh resistor R7 and a source of the seventh MOS transistor M7. Each of a source of the sixth MOS transistor M6 and a source of the eighth MOS transistor M8 is coupled to a gate of the thirteenth MOS transistor M13. Each of a gate of the seventh MOS transistor M7, a gate of eighth MOS transistor M8, a gate of the eleventh MOS transistor M11 and a first terminal of the eighth resistor R8 is coupled to the current source. Each of a source of the eleventh MOS transistor M11, a gate of the twelfth MOS transistor M12, a gate of the ninth MOS transistor M9 and a gate of the tenth MOS transistor M10 is coupled to a second terminal of the eighth resistor R8. A drain of the eleventh MOS transistor M11 is coupled to a source of the twelfth MOS transistor M12. A drain of the twelfth MOS transistor M12 is coupled to the ground. A drain of the seventh MOS transistor M7 is coupled to a source of the ninth MOS transistor M9. A drain of the ninth MOS transistor M9 is coupled to the ground. A drain of the eighth MOS transistor M8 is coupled to a source of the tenth MOS transistor M10. A drain of the tenth MOS transistor M10 is coupled to the ground. Each of a drain of the thirteenth MOS transistor M13 and a first terminal of the ninth resistor R9 is coupled to a first sampling signal VCS output terminal. A second terminal of the ninth resistor R9 is coupled to the ground.

In some embodiments, the full voltage sampling circuit further includes a sampling resistor Rcs. A first terminal of the sampling resistor Rcs is coupled to an input terminal of the first input voltage VSEN. A second terminal of the sampling resistor Rcs is coupled to an input terminal of the second input voltage ISEN. Voltages of two terminals of the sampling resistor Rcs are the first input voltage VSEN and the second input voltage ISEN, respectively. The full voltage sampling circuit performs sampling according to the first input voltage VSEN and the second input voltage ISEN to derive the voltage at the two terminals of the sampling resistor Rcs.

In some embodiments, each of the third MOS transistor M3, the fourth MOS transistor M4, the fifth MOS transistor M5, the sixth MOS transistor M6, the thirteenth MOS transistor M13 is a P-channel MOS transistor. Each of the seventh MOS transistor M7, the eighth MOS transistor M8, the ninth MOS transistor M9, the tenth MOS transistor M10, the eleventh MOS transistor M11, the twelfth MOS transistor M12 is a N-channel MOS transistor.

In some embodiments, width-to-length ratios of the seventh MOS transistor M7, the eighth MOS transistor M8 and the eleventh MOS transistor M11 are the same. Width-to-length ratios of the ninth MOS transistor M9, the tenth MOS transistor M10 and the twelfth MOS transistor M12 are the same. Width-to-length ratios of the third MOS transistor M3 and the fourth MOS transistor M4 are the same. Width-to-length ratios of the fifth MOS transistor M5 and the sixth MOS transistor M6 are the same.

According to principles of a current mirror, each of currents flowing through the ninth MOS transistor M9, the tenth MOS transistor M10, the third MOS transistor M3, the fourth MOS transistor M4 and the twelfth MOS transistor M12 has a current value of the current Ib provided by the current source.

In some embodiments, gate voltages of the third MOS transistor M3 and the fourth MOS transistor M4 are the same. Gate voltages of the fifth MOS transistor M5 and the sixth MOS transistor M6 are the same. A voltage V1 at the drain of the third MOS transistor M3 is approximately equal to a voltage V2 at the drain of the fourth MOS transistor M4.

In some embodiments, each of the resistance of the resistors R5 and R6 has a resistance Ra. Accordingly, following equations are derived: ISEN−V2=Ib×Ra, VSEN−V1=VSEN−ISEN+ISEN−V1=VRcs+ISEN−V2=VRcs+Ib×Ra. In which the voltage VRcs is a voltage between two terminals of the sampling resistor Rcs. A current flowing through the thirteenth MOS transistor M13 is VRcs/Ra. The voltage of the first sampling signal VCS is (VRcs/Ra)×Ra=VRcs. Accordingly, the sampling to the voltages at the two terminals of the sampling resistor Rcs is performed.

Figure 5:
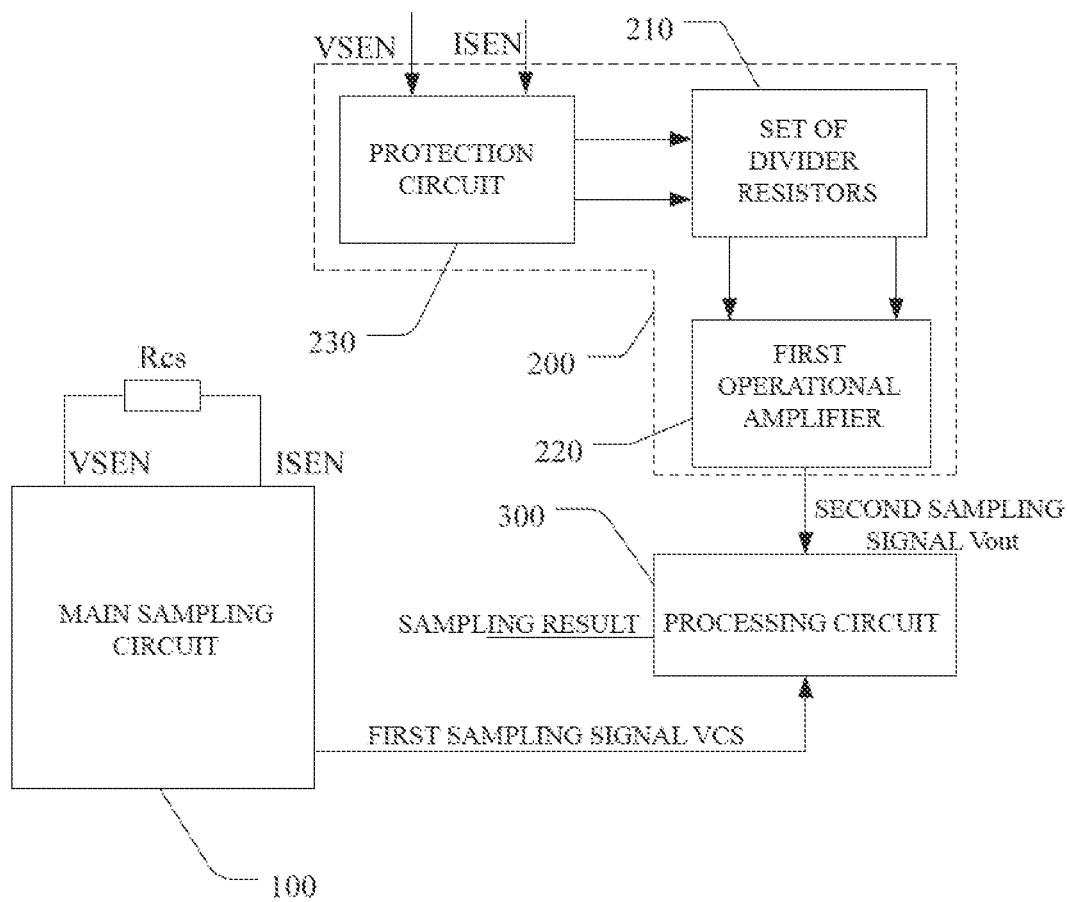
FIG. 5 is a structural block diagram of a protection load in the full voltage sampling circuit illustrated according to one embodiment of the present disclosure.

Referring to FIG. 5, in some embodiments, the assist sampling circuit 200 further includes a protection circuit 230. The protection circuit 230 is configured to receive the first input voltage VSEN and the second input voltage ISEN, and is coupled to the set of divider resistors 210. The protection circuit 230 is configured for providing overvoltage protection to an output load when the first input voltage VSEN is larger than a supply voltage VDD, to ensure the first operational amplifier 220 is not broken by the first input voltage VSEN larger than the supply voltage VDD, such that the assist sampling circuit 200 may performed multiple sampling operations.

Figure 6:
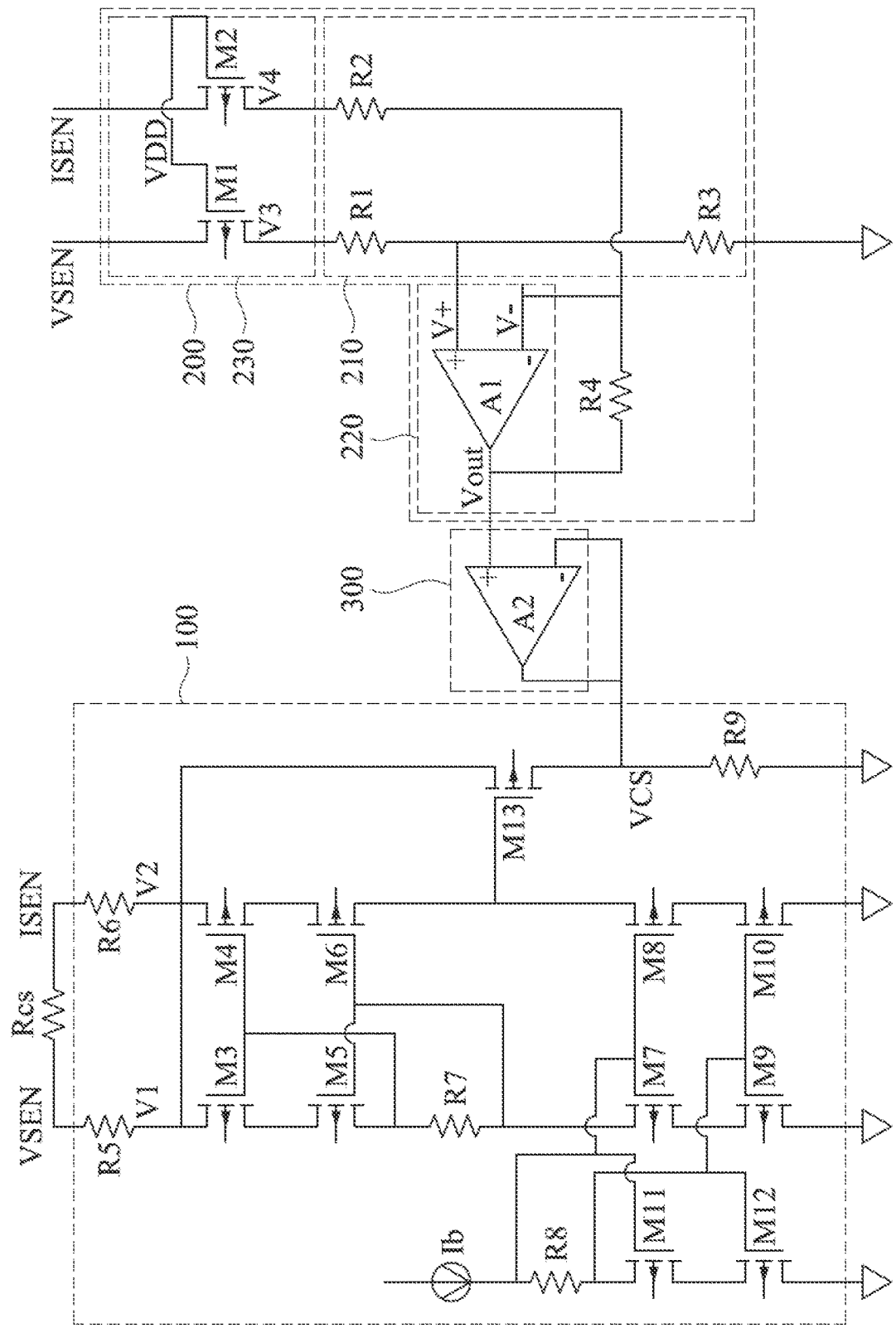
FIG. 6 is a circuit diagram of a protection load in the full voltage sampling circuit illustrated according to one embodiment of the present disclosure.

Referring to FIG. 6, in some embodiments, the protection circuit 230 includes a first MOS transistor M1 and a second MOS transistor M2. A source of the first MOS transistor M1 is configured to receive the first input voltage VSEN. Each of a gate of the first MOS transistor M1 and a gate of the second MOS transistor M2 is configured to receive the supply voltage VDD. A drain of the first MOS transistor M1 is coupled to the set of divider resistors 210. A source of the second MOS transistor M2 is configured to receive the second input voltage ISEN. A drain of the second MOS transistor M2 is coupled to the set of divider resistors 210.

In some embodiments, the first MOS transistor M1 and the second MOS transistor M2 are implemented by high voltage MOS transistors, and are N-channel MOS transistors. Drain voltages of the first MOS transistor M1 and the second MOS transistor M2 have high tolerance. Gate voltages of the first MOS transistor M1 and the second MOS transistor M2 are the supply voltage VDD.

In some embodiments, when the first input voltage VSEN is high, the first MOS transistor M1 and the second MOS transistor M2 operate in a saturation region, and block a high voltage of the first input voltage VSEN, such that the first operational amplifier 220 is not broken and is protected effectively. When the first input voltage VSEN is low, the first MOS transistor M1 and the second MOS transistor M2 operate in a linear region, have small effective resistances that can be neglected. Accordingly, a voltage V3 of the drain of the first MOS transistor M1 and a voltage V4 of the drain of the second MOS transistor M2 are approximately equal to the first input voltage VSEN and the second input voltage ISEN, respectively.

In some embodiments, resistances of the resistors R1 and R2 are approximately equal to resistances of the resistors R3 and R4, respectively. According to principles of virtual short circuits and virtual open circuits, following equations are derived: V+=VSEN/2=V−=(ISEN+Vout)/2, Vout=VSEN−ISEN=VRcs. In which the voltage V+ is the voltage of the positive phase terminal of the first operational amplifier 220, and the voltage V− is the voltage of the negative phase terminal of the first operational amplifier 220. Accordingly, the sampling to two terminals of the sampling resistor Rcs is performed.

In some embodiments, when the voltage of the first sampling signal VCS derived by the main sampling circuit 100 is smaller than the voltage of the sampling resistor Rcs, the second operational amplifier A2 outputs the second sampling signal Vout as the sampling result. As the input voltages are increased, voltage values of the source voltages V3 and V4 of the first MOS transistor M1 and the second MOS transistor M2 approach the voltage value of the supply voltage VDD, and a difference between the source voltages V3 and V4 is decreased. At this moment, the voltage of the second sampling signal Vout is decreased, and the voltage of the first sampling signal VCS outputted by the main sampling circuit 100 is increased to reach the voltage of the sampling resistor Rcs. When the voltage of the first sampling signal VCS is larger than the voltage of the second sampling signal Vout, the second operational amplifier A2 is turned off, and the first sampling signal VCS is outputted as the sampling result.

In some embodiments, when the first input voltage VSEN is high, the third MOS transistor M3, the fourth MOS transistor M4, the fifth MOS transistor M5, the sixth MOS transistor M6, the thirteenth MOS transistor M13 can be implemented by high voltage transistors or low voltage isolation transistors. Drain/source terminals of the third MOS transistor M3, the fourth MOS transistor M4, the fifth MOS transistor M5, the sixth MOS transistor M6, the thirteenth MOS transistor M13 consume certain voltage drop to satisfy a requirement of operating in the saturation region. When the input voltage is too low, the main sampling circuit 100 cannot operate normally. With configuring the assist sampling circuit 200 and the processing circuit 300, the main sampling circuit 100 can operate normally under high voltages, and the assist sampling circuit 200 can operate normally under low voltages. Accordingly, the accurate sampling under high and low voltages is achieved, an operating range of the sampling circuit is widened, the sampling in a full voltage range can be performed.

In some embodiments, the present disclosure further provides a driving chip. The driving chip includes at least a portion of the full voltage sampling circuit described above. The supply voltage VDD received by the gates of the first MOS transistor M1 and the second MOS transistor M2 in the full voltage sampling circuit is a supply voltage inside the chip.

In some embodiments, the driving chip can be applied in a LED driving circuit or a DC-DC converter. When the driving chip is applied in the DC-DC converter at a current mode, an inductor current is sampled to achieve modulating to output voltages. When the driving chip is applied in the LED driving circuit, an inductor current is sampled to achieve constant current controlling of the LED. Details of the full voltage sampling circuit described above are described above, and not repeated for brevity.

Figure 7:
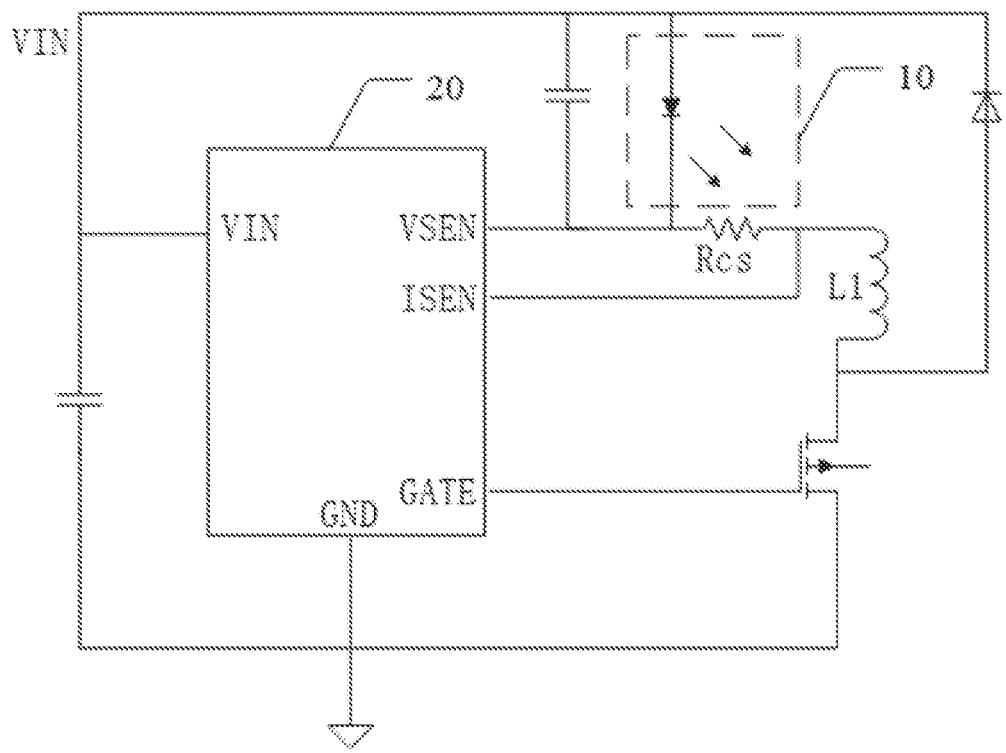
FIG. 7 is a circuit diagram of a LED driving circuit illustrated according to one embodiment of the present disclosure.

Referring to FIG. 7, the present disclosure further provides a LED driving circuit. The LED driving circuit includes an inductor L1, the sampling resistor Rcs and the full voltage sampling circuit described above. In the embodiment shown in FIG. 7, the full voltage sampling circuit is applied to a LED driving chip 20. The inductor L1 and a LED light emitting load 10 are coupled in series. The sampling resistor Rcs and the inductor L1 are coupled in series. The full voltage sampling circuit is configured to sense an induced current flowing through the LED light emitting load 10 through the sampling resistor Rcs, to control the current of the LED light emitting load 10. The LED light emitting load 10 is configured to emit light.

Figure 8:
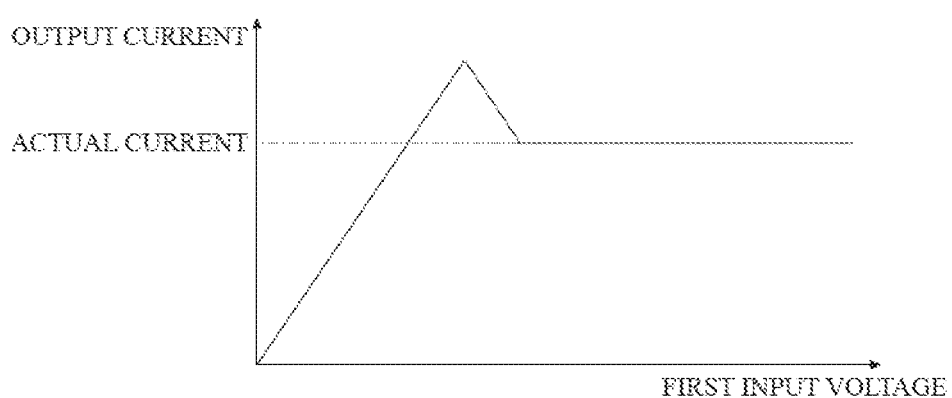
FIG. 8 is a schematic diagram of output currents of an existing LED driving circuit.

In some approaches, only the main sampling circuit 100 is used by a LED driving circuit. An input voltage VIN is powered slowly, and the first input voltage VSEN is raised from a zero voltage level. When the input voltage VIN is just powered, a differential voltage derived by sampling is smaller than the voltage of the sampling resistor Rcs. If the differential voltage derived by sampling is compared with a benchmark voltage inside the chip, an actual output current is larger than the current for normal operations. As a result, a larger overshoot shown in FIG. 8 occurs at an enable power stage to break the LED light emitting load 10.

Compared to previous approaches, in embodiments of present disclosure, when the first input voltage VSEN is low, the second sampling signal Vout corresponds to the voltage of two terminals of the sampling resistor Rcs. Accordingly, the overshoot problem is solved, and safety of the LED light emitting load 10 and stability of the LED driving circuit are increased. Details of the full voltage sampling circuit are described above, and thus not repeated for brevity.

Figure 9:
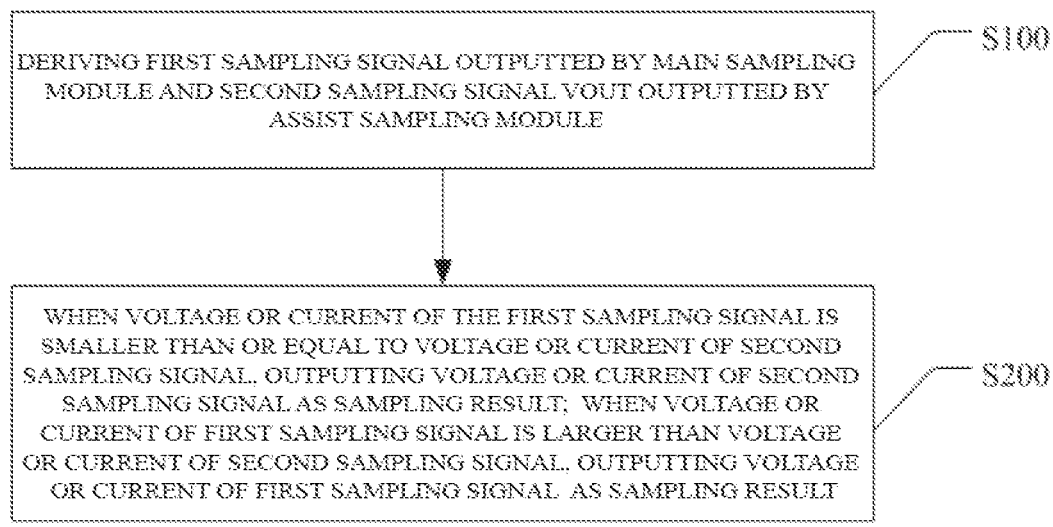
FIG. 9 is a flowchart diagram of a sampling method illustrated according to one embodiment of the present disclosure.

Referring to FIG. 9, the present disclosure further provides a sampling method. The sampling method can be applied to the full voltage sampling circuit described above, and includes operations S100 and S200.

At the operation S100, the first sampling signal VCS outputted by the main sampling circuit 100 and the second sampling signal Vout outputted by the assist sampling circuit 200 are derived.

At the operation S200, when the voltage or the current of the first sampling signal VCS is smaller than or equal to the voltage or the current of the second sampling signal Vout, the voltage or the current of the second sampling signal Vout is outputted as the sampling result. When the voltage or the current of the first sampling signal VCS is larger than the voltage or the current of the second sampling signal Vout, the voltage or the current of the first sampling signal VCS is outputted as the sampling result.

In some embodiments, when the sampling is performed, the first sampling signal VCS outputted by the main sampling circuit 100 and the second sampling signal Vout outputted by the assist sampling circuit 200 are derived. The magnitudes of voltage values or current values of two sampling signals VCS and Vout corresponding to the first input voltage VSEN and the second input voltage ISEN are compared. In order to prevent the sampling result, obtained by sampling, from being smaller than the actual differential voltage when the input voltage is too small, the processing circuit 300 selects a larger one of the voltages or currents of the first sampling signal VCS and the second sampling signal Vout as the sampling result to be outputted, such that the sampling result is not affected by the magnitudes of the input voltages, and thus an accuracy of the sampling result is ensured.

In summary, the present disclosure provides a full voltage sampling circuit, a driving chip, a LED driving circuit and a sampling method. The full voltage sampling circuit includes a main sampling circuit, an assist sampling circuit and a processing circuit. The main sampling circuit is configured to receive a first input voltage and a second input voltage, and configured to output a first sampling signal according to the first input voltage and the second input voltage. The first sampling signal represents a differential voltage which indicates a difference between the first input voltage and the second input voltage. The assist sampling circuit is configured to receive the first input voltage and the second input voltage, and configured to output a second sampling signal according to the first input voltage and the second input voltage. The second sampling signal also represents the differential voltage. The processing circuit is coupled to the main sampling circuit and the assist sampling circuit, and configured to select a larger one of currents or voltages of the first sampling signal and the second sampling signal as a sampling result to be outputted, and thus an accuracy of the sampling result is the full voltage range is ensured.

Although the present disclosure has been described in considerable detail with reference to certain embodiments thereof, other embodiments are possible. Therefore, the spirit and scope of the appended claims should not be limited to the description of the embodiments contained in the present disclosure.

It will be apparent to those skilled in the art that various modifications and variations can be made to the structure of the present disclosure without departing from the scope or spirit of the disclosure. In view of the foregoing, it is intended that the present disclosure cover modifications and variations of the present disclosure provided they fall within the scope of the following claims.

What is claimed is:

1. A full voltage sampling circuit, comprising:
    a main sampling circuit configured to receive a first input voltage and a second input voltage, and configured to output a first sampling signal according to the first input voltage and the second input voltage, wherein the first sampling signal represents a differential voltage which indicates a difference between the first input voltage and the second input voltage;
    an assist sampling circuit configured to receive the first input voltage and the second input voltage, and configured to output a second sampling signal according to the first input voltage and the second input voltage, wherein the second sampling signal represents the differential voltage; and
    a processing circuit coupled to the main sampling circuit and the assist sampling circuit, and configured to select a larger one of currents or voltages of the first sampling signal and the second sampling signal as a sampling result to be outputted.

2. The full voltage sampling circuit of claim 1, wherein when the first input voltage is smaller than a reference voltage, the processing circuit is configured to output the second sampling signal as the sampling result, and when the first input voltage is larger than the reference voltage, the processing circuit is configured to output the first sampling signal as the sampling result.

3. The full voltage sampling circuit of claim 2, wherein when the first input voltage is smaller than the reference voltage, a difference between a differential voltage and a voltage of the first sampling signal is decreased as the first input voltage is increased.

4. The full voltage sampling circuit of claim 2, wherein when the first input voltage is larger than the reference voltage, a difference between a differential voltage and a voltage of the second sampling signal is increased as the first input voltage is increased.

5. The full voltage sampling circuit of claim 2, wherein when the first input voltage is smaller than the reference voltage, a voltage or a current of the first sampling signal is clamped as a voltage or a current of the second sampling signal.

6. The full voltage sampling circuit of claim 1, wherein the assist sampling circuit comprises:
    a set of divider resistors configured to divide the first input voltage and the second input voltage, and configured to output a first divided voltage corresponding to the first input voltage and a second divided voltage corresponding to the second input voltage; and
    a first operational amplifier coupled to the set of divider resistors, and configured to output the second sampling signal according to the first divided voltage and the second divided voltage.

7. The full voltage sampling circuit of claim 6, wherein the set of divider resistors comprises:
    a first resistor, wherein a first terminal of the first resistor is configured to receive the first input voltage, and a second terminal of the first resistor is coupled to a first input terminal of the first operational amplifier; and
    a second resistor, wherein a first terminal of the second resistor is configured to receive the second input voltage, and a second terminal of the second resistor is coupled to a second input terminal of the first operational amplifier.

8. The full voltage sampling circuit of claim 7, wherein the set of divider resistors comprises:
    a third resistor, wherein a first terminal of the third resistor is coupled to the first input terminal of the first operational amplifier, and a second terminal of the third resistor is coupled to a ground; and
    a fourth resistor, wherein a first terminal of the fourth resistor is coupled to an output terminal of the first operational amplifier, and a second terminal of the fourth resistor is coupled to the second input terminal of the first operational amplifier.

9. The full voltage sampling circuit of claim 6, wherein the assist sampling circuit further comprises:
    a protection circuit configured to receive the first input voltage and the second input voltage, coupled to the set of divider resistors, and configured to clamp the first input voltage and provide overvoltage protection for the first operational amplifier when the first input voltage is higher than a supply voltage.

10. The full voltage sampling circuit of claim 9, wherein the protection circuit comprises:
    a first switch, wherein a first terminal of the first switch is configured to receive the first input voltage, a control terminal of the first switch is configured to receive the supply voltage, and a second terminal of the first switch is coupled to the set of divider resistors; and
    a second switch, wherein a first terminal of the second switch is configured to receive the second input voltage, a control terminal of the second switch is configured to receive the supply voltage, and a second terminal of the second switch is coupled to the set of divider resistors.

11. The full voltage sampling circuit of claim 1, wherein the processing circuit comprises:
    a second operational amplifier, wherein a first input terminal of the second operational amplifier is configured to receive the second sampling signal, a second input terminal of the second operational amplifier is coupled to an output terminal of the second operational amplifier, and the output terminal of the second operational amplifier is coupled to the main sampling circuit.

12. A driving chip, comprising the full voltage sampling circuit of claim 1, and applied to a light emitting diode driving circuit or a direct current to direct current converter.

13. A light emitting diode (LED) driving circuit, comprising:
    an inductor coupled in series with a LED light emitting load;
    a sampling resistor coupled in series with the inductor; and the full voltage sampling circuit of claim 1, configured to sense an current flowing through the LED light emitting load by the sampling resistor.

14. The light emitting diode driving circuit of claim 13, wherein the main sampling circuit comprises:
   a first switch, wherein the main sampling circuit is configured to output the first sampling signal at a first terminal of the first switch;
   a first resistor coupled between a first terminal of the sampling resistor and a second terminal of the first switch; and
   a second resistor coupled between a second terminal of the sampling resistor and a gate terminal of the first switch, and
   the processing circuit comprises a first operational amplifier, wherein a first input terminal of the first operational amplifier is configured to receive the first sampling signal, a second input terminal of the first operational amplifier is configured to receive the second sampling signal and is coupled to an output terminal of the first operational amplifier.

15. The light emitting diode driving circuit of claim 14, wherein the assist sampling circuit comprises:
   a second operational amplifier configured to output the second sampling signal;
   a second switch configured to receive the first sampling signal;
   a third switch configured to receive the second sampling signal;
   a third resistor coupled between the second switch and a first input terminal of the second operational amplifier; and
   a fourth resistor coupled between the third switch and a second input terminal of the second operational amplifier.

16. The light emitting diode driving circuit of claim 15, wherein the assist sampling circuit further comprises:
   a fifth resistor coupled between an output terminal of the second operational amplifier and the second input terminal of the second operational amplifier.

17. The light emitting diode driving circuit of claim 15, wherein the assist sampling circuit further comprises:
   a sixth resistor coupled between a ground and the first input terminal of the second amplifier,
   wherein resistances of the sixth resistor and the third resistor are the same.

18. A sampling method applied to the full voltage sampling circuit of claim 1, comprising:
   deriving the first sampling signal outputted by the main sampling circuit and the second sampling signal outputted by the assist sampling circuit;
   when a voltage or a current of the first sampling signal is smaller than or equal to a voltage or a current of the second sampling signal, outputting the voltage or the current of the second sampling signal as the sampling result; and
   when the voltage or the current of the first sampling signal is larger than the voltage or the current of the second sampling signal, outputting the voltage or the current of the first sampling signal as the sampling result.

19. The sampling method of claim 18, wherein deriving the second sampling signal comprises:
   generating a first divided voltage, by a first set of resistors coupled in series, according to the first input voltage;
   generating a second divided voltage, by a second set of resistors coupled in series, according to the second input voltage; and
   generating the second sampling signal, by a first operational amplifier, according to the first divided voltage and the second divided voltage.

20. The sampling method of claim 18, further comprising:
   receiving the first sampling signal and the second sampling signal by a second operational amplifier,
   wherein an input terminal of the second operational amplifier is coupled to an output terminal of the second operational amplifier.

* * * * *